(12) United States Patent
Kuo et al.

(10) Patent No.: US 8,564,353 B2
(45) Date of Patent: Oct. 22, 2013

(54) TEMPERATURE SENSITIVE DEVICE FOR GENERATING A TEMPERATURE-DEPENDENT OUTPUT SIGNAL THAT IS SUBSTANTIALLY INDEPENDENT OF DEVICE MANUFACTURING PROCESS

(75) Inventors: Tzu-Yuan Kuo, Changhua County (TW); Tieh-Yen Chang, Changhua County (TW)

(73) Assignee: ILI Technology Corporation (TW)

( * ) Notice: Subject to any disclaimer, the term of this patent is extended or adjusted under 35 U.S.C. 154(b) by 0 days.

(21) Appl. No.: 13/408,285

(22) Filed: Feb. 29, 2012

(65) Prior Publication Data

US 2013/0099842 A1    Apr. 25, 2013

(30) Foreign Application Priority Data

Oct. 19, 2011   (TW) .............................. 100137941 A

(51) Int. Cl.
*H03H 11/26* (2006.01)
*H03K 3/42* (2006.01)

(52) U.S. Cl.
USPC ............................ 327/262; 327/261; 327/513

(58) Field of Classification Search
USPC ......... 327/291, 293, 261, 263, 264, 268, 272, 327/276–278, 284, 285, 512, 513, 262
See application file for complete search history.

(56) References Cited

U.S. PATENT DOCUMENTS

| 4,710,653 | A  | * | 12/1987 | Yee | ................................. | 327/38 |
| 6,967,521 | B2 | * | 11/2005 | Lee | ................................. | 327/512 |
| 7,772,908 | B2 | * | 8/2010  | Sinha et al. | .................... | 327/261 |
| 8,294,502 | B2 | * | 10/2012 | Lewis | .......................... | 327/261 |

* cited by examiner

*Primary Examiner* — Hai L Nguyen
(74) *Attorney, Agent, or Firm* — Banner & Witcoff, Ltd.

(57) ABSTRACT

A temperature sensitive device includes a first delay unit generating a first delayed signal, a second delay unit generating a second delayed signal, a difference generating unit generating an indication signal according to the first delayed signal and the second delayed signal, and a processing unit generating an output signal that is dependent on the temperature sensed by the temperature sensitive device and substantially independent of the manufacturing process of the temperature sensitive device.

12 Claims, 10 Drawing Sheets

TEMPERATURE SENSITIVE DEVICE FOR GENERATING A TEMPERATURE-DEPENDENT OUTPUT SIGNAL THAT IS SUBSTANTIALLY INDEPENDENT OF DEVICE MANUFACTURING PROCESS

CROSS-REFERENCE TO RELATED APPLICATION

This application claims priority to Taiwanese Application No. 100137941, filed on Oct. 19, 2011.

BACKGROUND OF THE INVENTION

1. Field of the Invention

The invention relates to a temperature sensitive device, and more particularly to a temperature sensitive device capable of generating an effect comparable to two-point calibration through a single one-point calibration.

2. Description of the Related Art

FIG. 1 is a diagram showing the relationships of three output signals that are respectively from three temperature sensitive devices (not shown) manufactured with different manufacturing process drifts and calibrated through the conventional one-point calibration. The output signals of the temperature sensitive devices substantially have the same magnitude only at a temperature $T_1$ corresponding to a calibration point A. Differences among the output signals from the temperature sensitive devices that use one-point calibration thus will become bigger as the sensed temperature approaches a lowest temperature $T_1-\Delta T$ or a highest temperature $T_1+\Delta T$ of a sensing range.

Referring to FIG. 2, in order to alleviate the above drawback of one-point calibration, a calibration point B that is different from the calibration point A must be introduced, such that the output signals of the temperature sensitive devices will have approximate magnitudes when the temperature that is being sensed ranges between $T_1$ and $T_2$, wherein $T_1$ is the temperature corresponding to the calibration point A and $T_2$ is the temperature corresponding to the calibration point B, and a sensing range is defined between $T_1$ and $T_2$.

Therefore, it is evident that the differences among the output signals from the temperature sensitive devices adopting conventional one-point calibration within sensing ranges thereof are larger than the differences among the output signals from the temperature sensitive devices adopting two-point calibration within sensing ranges thereof.

SUMMARY OF THE INVENTION

The object of the present invention is to provide a temperature sensitive device capable of generating an effect comparable to two-point calibration through a single one-point calibration.

According to the present invention, a temperature sensitive device comprises:

a first delay unit for receiving an input signal and for introducing a first time delay into the input signal so as to generate a first delayed signal, wherein the first time delay is dependent on a manufacturing process of the temperature sensitive device and is substantially independent of a temperature sensed by the temperature sensitive device;

a second delay unit for receiving the input signal and for introducing a second time delay into the input signal so as to generate a second delayed signal, wherein the second time delay is dependent on the manufacturing process of the temperature sensitive device and the temperature sensed by the temperature sensitive device, and wherein the first time delay and the second time delay are substantially the same when the temperature sensed by the temperature sensitive device is at a first temperature value;

a difference generating unit electrically coupled to the first delay unit and the second delay unit so as to receive the first delayed signal and the second delayed signal therefrom; the difference generating unit generating an indication signal according to the first delayed signal and the second delayed signal; the indication signal indicating a difference between the first time delay and the second time delay; and a processing unit electrically coupled to the difference generating unit so as to receive the indication signal therefrom, the processing unit generating an output signal according to the indication signal and a reference signal, wherein the reference signal indicates a difference between the first time delay and the second time delay when the temperature sensed by the temperature sensitive device is at a second temperature value, and the output signal is dependent on the temperature sensed by the temperature sensitive device and is substantially independent of the manufacturing process of the temperature sensitive device.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
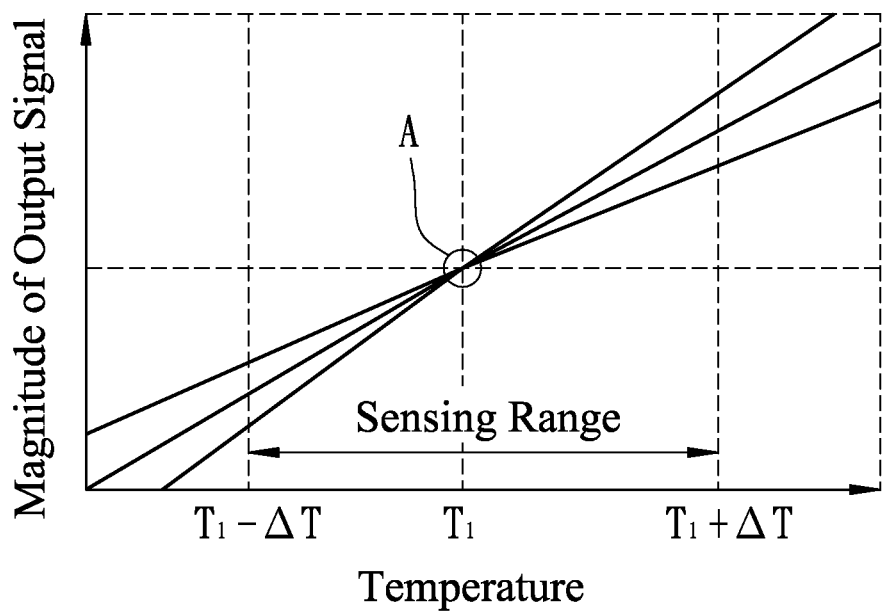
FIG. 1 shows the relationships of three output signals that are respectively from three temperature sensitive devices manufactured with different manufacturing process drifts and calibrated through the conventional one-point calibration.
Figure 2:
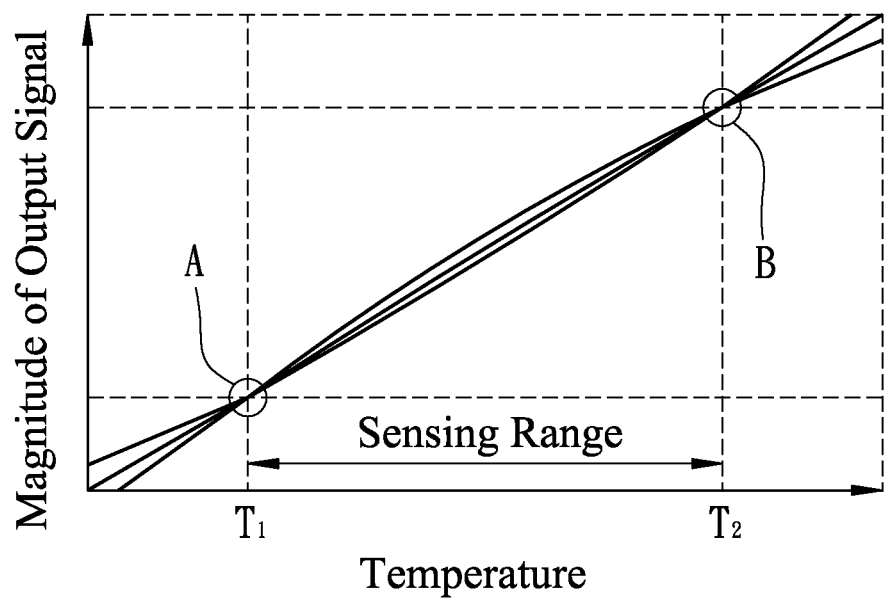
FIG. 2 shows the relationships of three output signals that are respectively from three temperature sensitive devices manufactured with different manufacturing process drifts and calibrated through the conventional two-point calibration.
Figure 3:
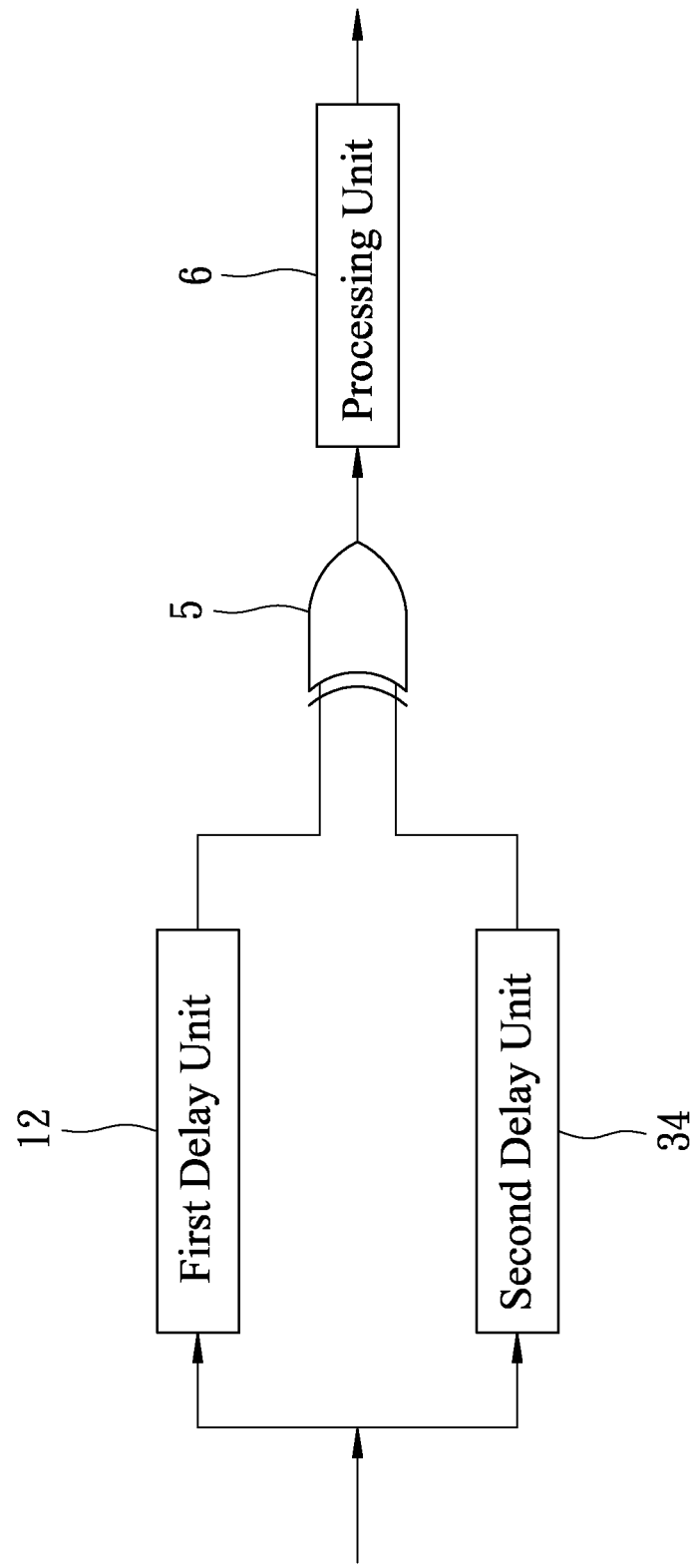
FIG. 3 is a block diagram showing a preferred embodiment of the temperature sensitive device according to the present invention.
Figure 4:
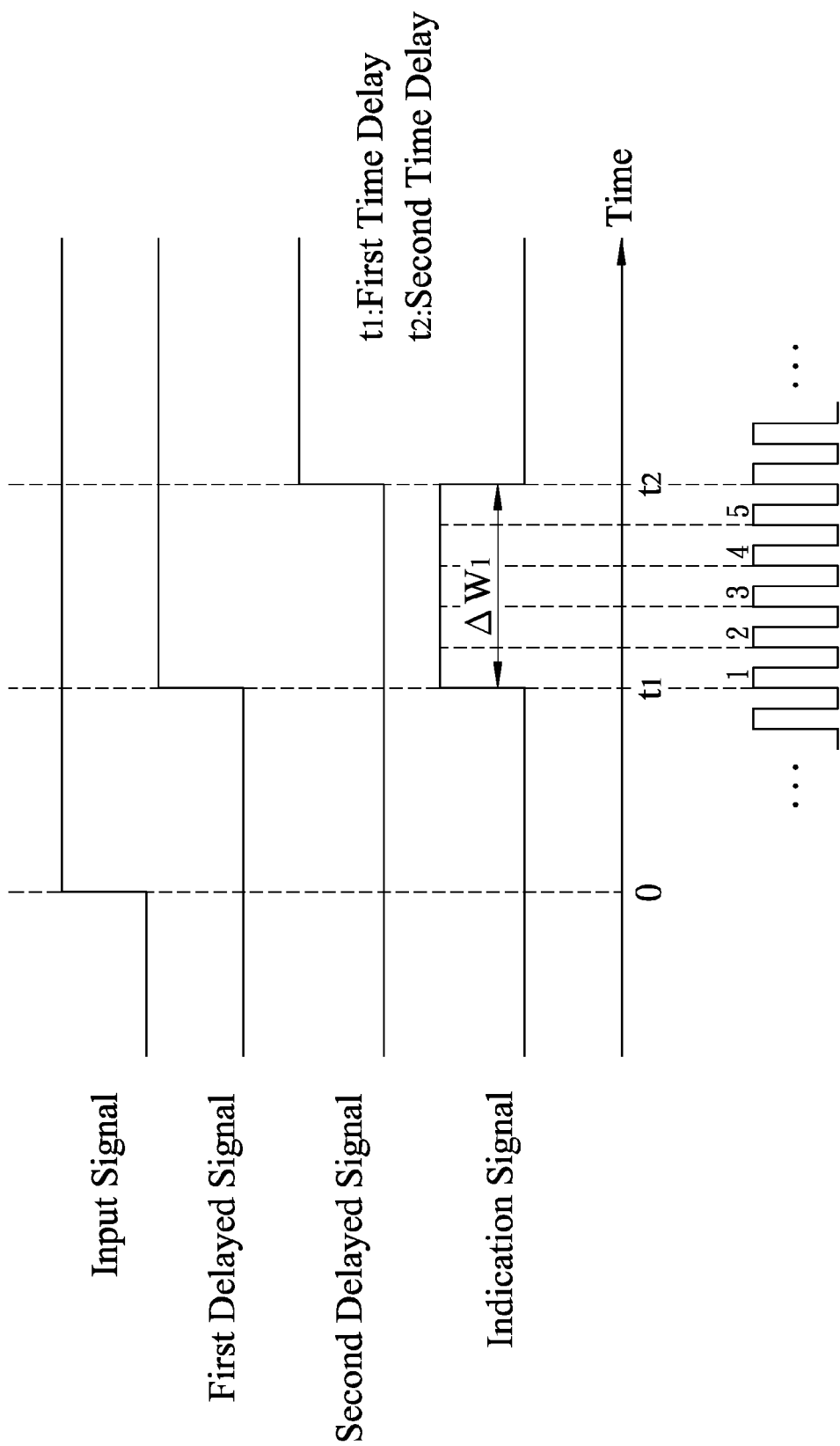
FIG. 4 is a timing diagram of the preferred embodiment.

Referring to FIG. 3 and FIG. 4, the preferred embodiment of a temperature sensitive device according to the present invention is shown to comprise a first delay unit 12, a second delay unit 34, a difference generating unit 5, and a processing unit 6.

The first delay unit 12 receives an input signal that is to trigger operation of the temperature sensitive device, and introduces a first time delay into the input signal so as to generate a first delayed signal, wherein the first time delay is dependent on a manufacturing process of the temperature sensitive device and is substantially independent of a temperature sensed by the temperature sensitive device.

The second delay unit 34 receives the input signal and introduces a second time delay into the input signal so as to generate a second delayed signal, wherein the second time delay is dependent on the manufacturing process of the temperature sensitive device and the temperature sensed by the temperature sensitive device, and wherein the first time delay and the second time delay are substantially the same when a temperature sensed by the temperature sensitive device is at a first temperature value (that is, the temperature is at a first temperature).

The difference generating unit 5 is electrically coupled to the first delay unit 12 and the second delay unit 34 so as to receive the first delayed signal and the second delayed signal therefrom. The difference generating unit 5 generates an indication signal according to the first delayed signal and the second delayed signal. The indication signal indicates a difference between the first time delay and the second time delay. In this embodiment, the difference generating unit 5 is configured to perform an exclusive or (XOR) logic operation on the first delayed signal and the second delayed signal to generate the indication signal. The indication signal is in a form of a pulse signal, and a pulse width of the indication signal is proportional to the difference between the first time delay and the second time delay.

The processing unit 6 is electrically coupled to the difference generating unit 5 so as to receive the indication signal therefrom. The processing unit 6 generates an output signal according to the indication signal and a reference signal, wherein the reference signal indicates a difference between the first time delay and the second time delay when a temperature sensed by the temperature sensitive device is at a second temperature value (that is, the temperature is at a second temperature), and the output signal is dependent on the temperature sensed by the temperature sensitive device and is substantially independent of the manufacturing process of the temperature sensitive device.

Figure 5:
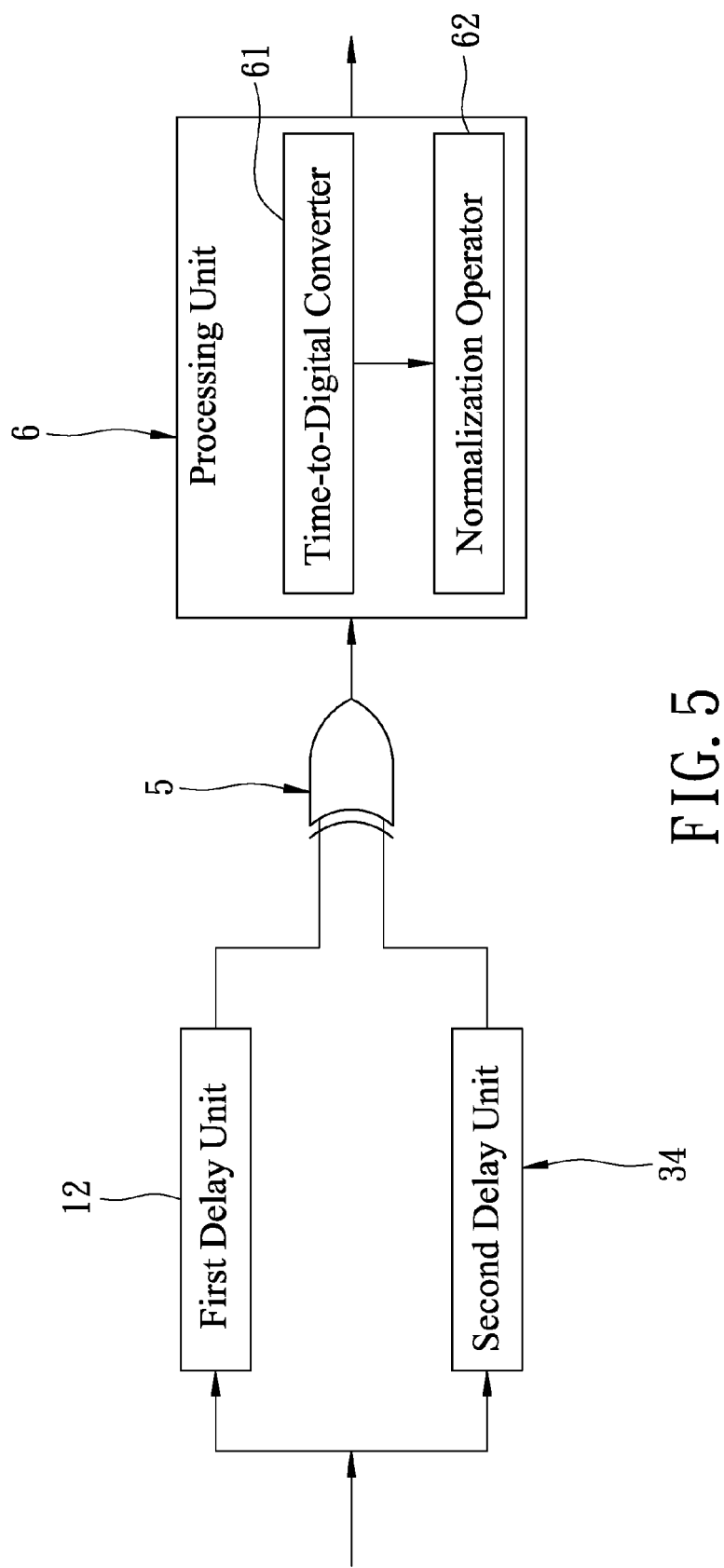
FIG. 5 is a block diagram showing a first implementation of the preferred embodiment.

Referring to FIG. 4 and FIG. 5, the processing unit 6 according to a first implementation of the preferred embodiment includes a time-to-digital converter 61 and a normalization operator 62. The time-to-digital converter 61 performs a time-to-digital conversion operation upon the indication signal to obtain a pulse width value corresponding to the pulse width of the indication signal. The normalization operator 62 generates the output signal based upon the pulse width value and the reference signal.

For example, the indication signal is a pulse signal. The pulse width of the indication signal would be converted to a pulse width value $W_1(P, T)$ through the time-to-digital conversion operation, wherein the pulse width value $W_1(P, T)$ is dependent on the manufacturing process P of the temperature sensitive device and the temperature T sensed by the temperature sensitive device. The reference signal is a pulse width value $W_2(P, T_2)$ converted through the time-to-digital conversion operation from the indication signal that is obtained when temperature of an environment where the temperature sensitive device is placed is at the second temperature value (such as 25° C.), and the $W_2(P, T_2)$ is dependent on the manufacturing process P of the temperature sensitive device. The output signal $Q_{out}(T)$ is obtained according to the ratio of the time difference indicated by the indication signal to the time difference indicated by the reference signal. In this embodiment, $Q_{out}(T)=W_1(P,T)/W_2(P,T_2)$. That is, the output signal $Q_{out}(T)$ results from the normalization of the pulse width value $W_1(P, T)$ by the pulse width value $W_2(P, T_2)$, wherein the $W_1(P, T)$ is related to the indication signal and the $W_2(P, T_2)$ is related to the reference signal.

Figure 6:
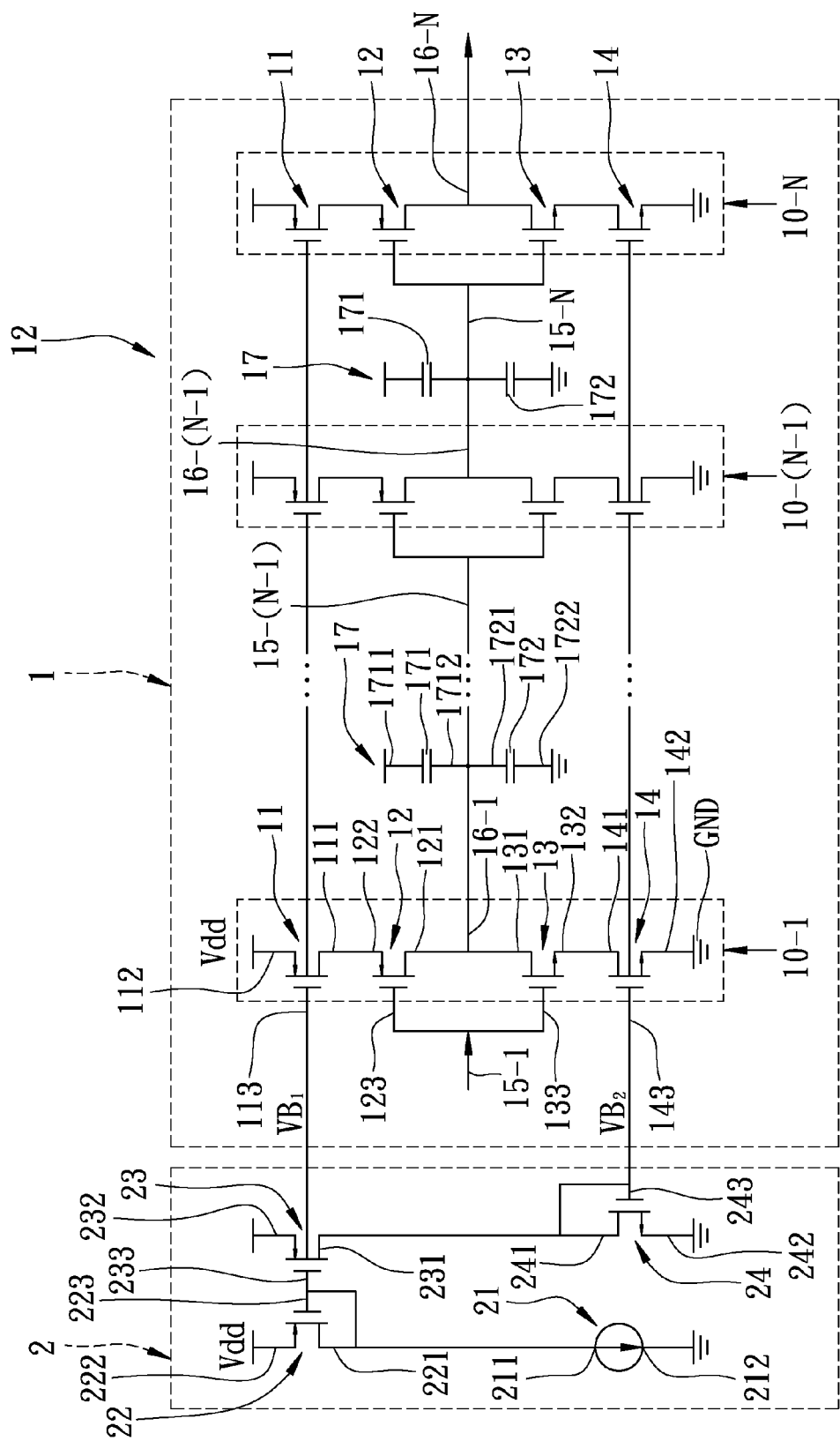
FIG. 6 is a circuit diagram of a first delay unit of the preferred embodiment.

Referring to FIG. 4 and FIG. 6, the first delay unit 12 includes a first delay circuit 1 and a first bias circuit 2. The first delay circuit 1 receives the input signal and introduces the first time delay into the input signal so as to generate the first delayed signal. The first bias circuit 2 is electrically coupled to the first delay circuit 1 and generates a first current that has a magnitude substantially independent of the temperature sensed by the temperature sensitive device, and cooperates with the first delay circuit 1 to mirror the first current to the first delay circuit 1, wherein the first time delay corresponds to the first current.

The first delay circuit 1 includes first to $N^{th}$ delay elements 10-1~10-N connected in series and a number (N−1) of energy storage elements 17 each electrically connected to respective one of the first to $(N-1)^{th}$ delay elements 10-1~10-(N−1).

Each of the delay elements 10 has an input 15 and an output 16, wherein the input 15-1 of the first delay element 10-1 receives the input signal and the output 16-N of the $N^{th}$ delay element 10-N provides the first delayed signal.

Each of the delay elements 10 includes a first transistor 11, a second transistor 12, a third transistor 13, and a fourth transistor 14. The first transistor 11 has a first terminal 111, a second terminal 112 to receive a first voltage Vdd, and a control terminal 113 to receive a first bias voltage $VB_1$. The second transistor 12 has a first terminal 121 electrically connected to the output 16 of the delay element 10 to which the second transistor 12 belongs, a second terminal 122 electrically connected to the first terminal 111 of the first transistor 11, and a control terminal 123 electrically connected to the input 15 of the delay element 10 to which the second transistor 12 belongs. The third transistor 13 has a first terminal 131 electrically connected to the first terminal 121 of the second transistor 12, a second terminal 132, and a control terminal 133 electrically connected to the input 15 of the delay element 10 to which the third transistor 13 belongs. The fourth transistor 14 has a first terminal 141 electrically connected to the second terminal 132 of the third transistor 13, a second terminal 142 connected to ground GND, and a control terminal 143 to receive a second bias voltage $VB_2$.

Each of the energy storage elements 17 includes a first capacitor 171 and a second capacitor 172. The first capacitor 171 has a first terminal 1711 to receive the first voltage Vdd, and a second terminal 1712 electrically connected to the output 16 of the corresponding delay element 10. The second capacitor 172 has a first terminal 1721 electrically connected to the second terminal 1712 of the first capacitor 171, and a second terminal 1722 connected to ground GND.

The first bias circuit 2 includes a first current source 21, a fifth transistor 22, a sixth transistor 23, and a seventh transistor 24.

The first current source 21 adopts a bandgap circuit (not shown) to generate the first current that is independent of the temperature sensed by the temperature sensitive device, and the first current source 21 has a first terminal 211 and a second terminal 212 connected to ground GND. The fifth transistor 22 has a first terminal 221 electrically connected to the first terminal 211 of the current source 21, a second terminal 222 to receive the first voltage Vdd, and a control terminal 223 electrically connected to the first terminal 221 and providing the first bias voltage $VB_2$. The sixth transistor 23 has a first terminal 231, a second terminal 232 to receive the first voltage Vdd, and a control terminal 233 electrically connected to the control terminal 223 of the fifth transistor 22. The seventh transistor 24 has a first terminal 241 electrically connected to the first terminal 231 of the sixth transistor 23, a second terminal 242 connected to ground GND, and a control terminal 243 electrically connected to the first terminal 241 and providing the second bias voltage $VB_2$.

Because the first current is substantially independent of the temperature sensed by the temperature sensitive device, the currents of each first transistor 11 and each fourth transistor 14 of the first delay circuit 1 mirrored from the first current are also substantially independent of the temperature sensed by the temperature sensitive device. The first time delay of the first delayed signal is related to the magnitude of the currents flowing through each first transistor 11 and each fourth transistor 14. Accordingly, when smaller currents flow through each first transistor 11 and each fourth transistor 14 of the delay element 10, the response speed of the delay element 10 will be slower to result in a larger first time delay. The first time delay will be smaller when otherwise. Therefore, when the magnitude of the first current generated by the first current source 21 is substantially independent of the temperature sensed by the temperature sensitive device, the first time delay is also independent of the temperature and is controlled by controlling the magnitude of the first current.

It is worthwhile to note that, in the preferred embodiment, the first transistor 11, the second transistor 12, the fifth transistor 22, and the sixth transistor 23 are p-type transistors, whereas the third transistor 13, the fourth transistor 14, and the seventh transistor 24 are n-type transistors.

Figure 7:
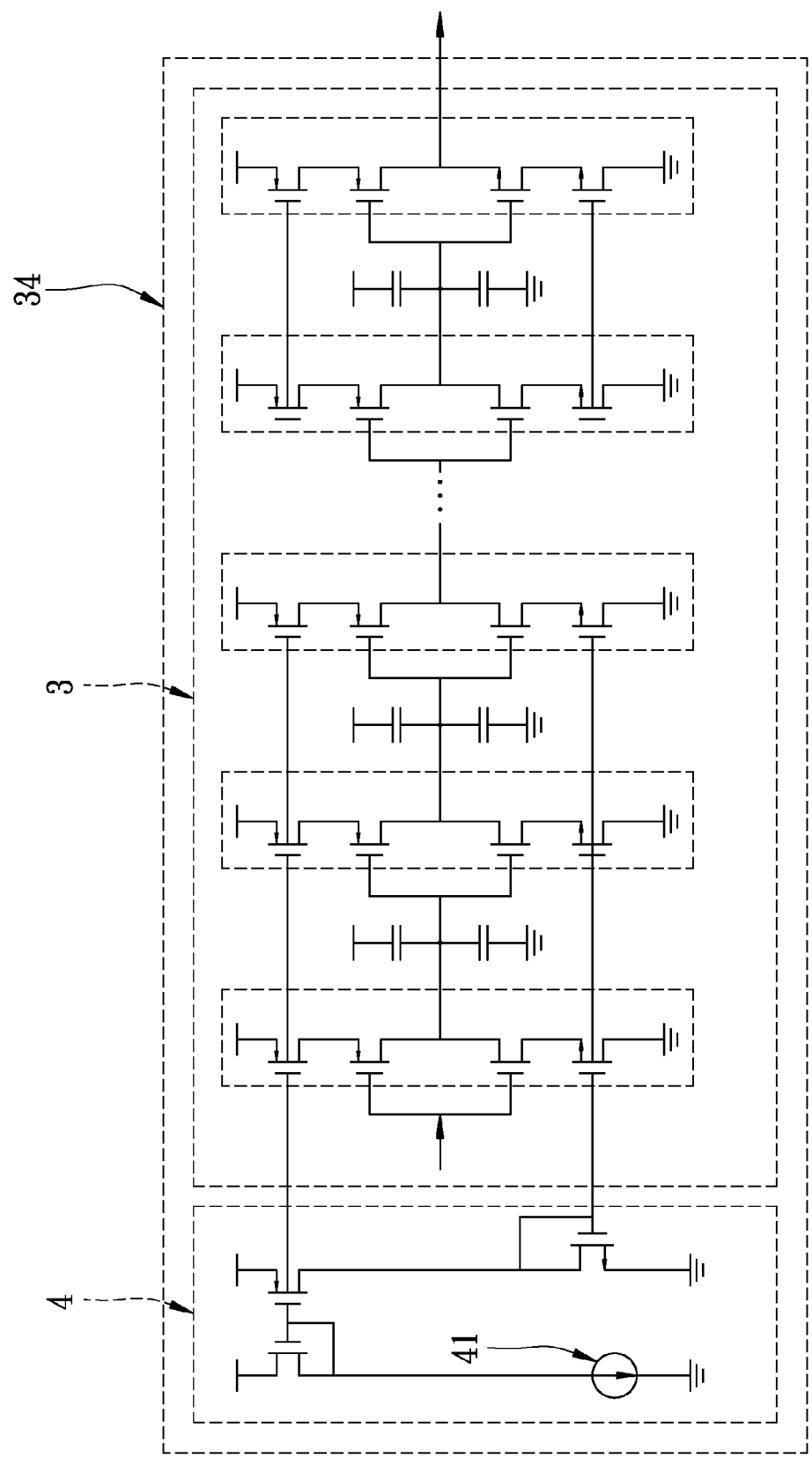
FIG. 7 is a circuit diagram of a second delay unit of the preferred embodiment.

Referring to FIG. 4, FIG. 6 and FIG. 7, the second delay unit 34 includes a second delay circuit 3 and a second bias circuit 4. The second delay circuit 3 receives the input signal and introduces the second time delay into the input signal so as to generate the second delayed signal. The second bias circuit 4 is electrically coupled to the second delay circuit 3 and generates a second current that has a magnitude dependent on the temperature sensed by the temperature sensitive device, and cooperates with the second delay circuit 3 to mirror the second current to the second delay circuit 3, wherein the second time delay corresponds to the second current. In this embodiment, the second delay circuit 3 and the first delay circuit 1 are identical in structure. The second bias circuit 4 and the first bias circuit 2 are similar. The difference between the second bias circuit 4 and the first bias circuit 2 is that a second current source 41 of the second bias circuit 4 adopts a proportional to absolute temperature (PTAT) circuit (not shown) to generate the second current that is dependent on the temperature sensed by the temperature sensitive device.

Figure 8:
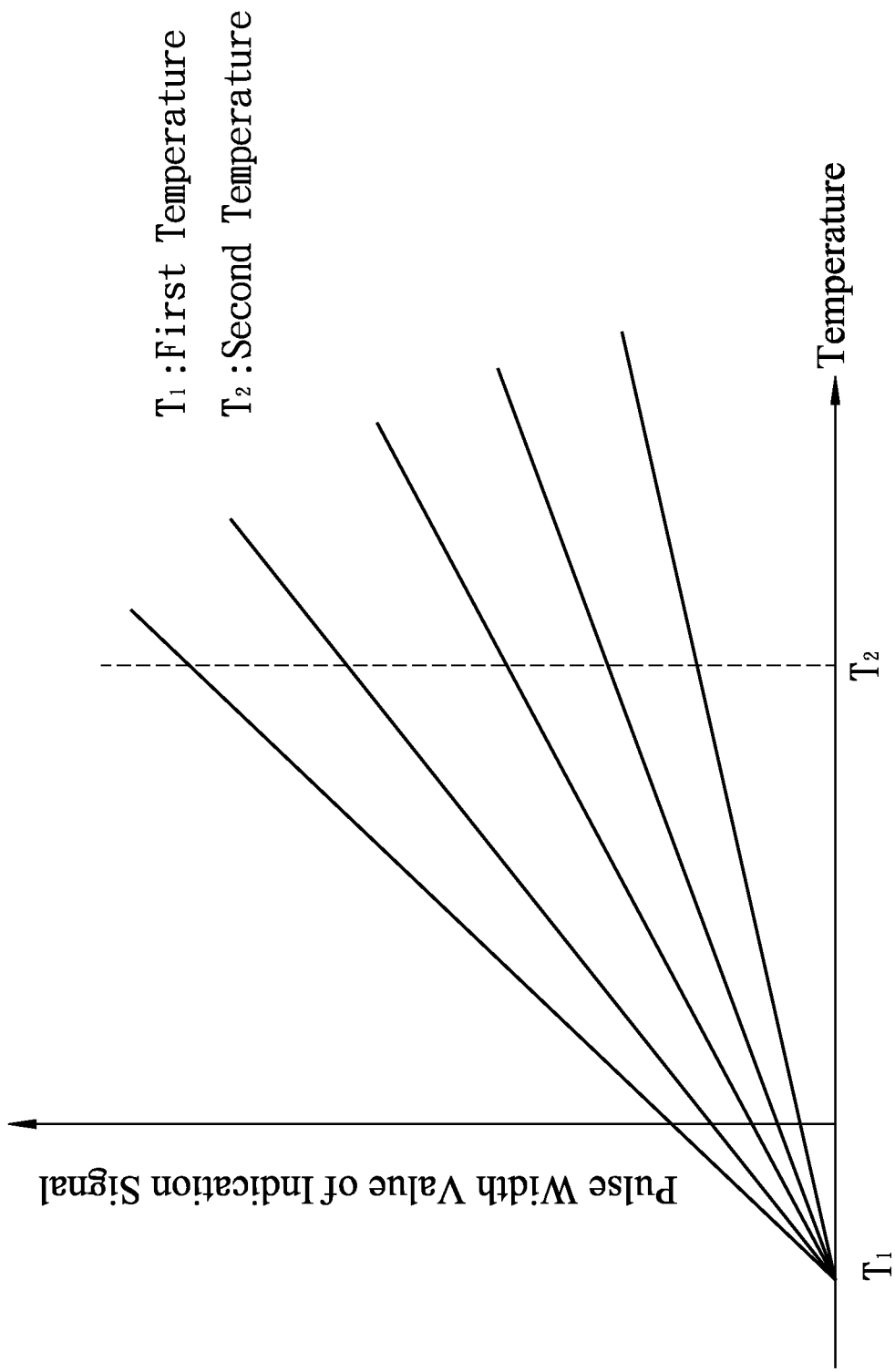
FIG. 8 shows the relationships of pulse width values of five indication signals to temperature variation, wherein the indication signals are respectively generated from five temperature sensitive devices of the preferred embodiment manufactured with different manufacturing process drifts.

Because the second delay circuit 3 is identical to the first delay circuit 1 in structure, as long as the magnitudes of the first current and the second current are designed to be substantially the same at the first temperature, the first time delay and the second time delay will be substantially the same at the first temperature. Thus, the difference between the first time delay $t_1$ and the second time delay $t_2$ will be zero, causing the pulse width of the indication signal $\Delta W_1$ which is proportional to the difference $t_2-t_1$ to also be zero at the first temperature, such that the effect of the one-point calibration is achieved as shown in FIG. 8.

Figure 9:
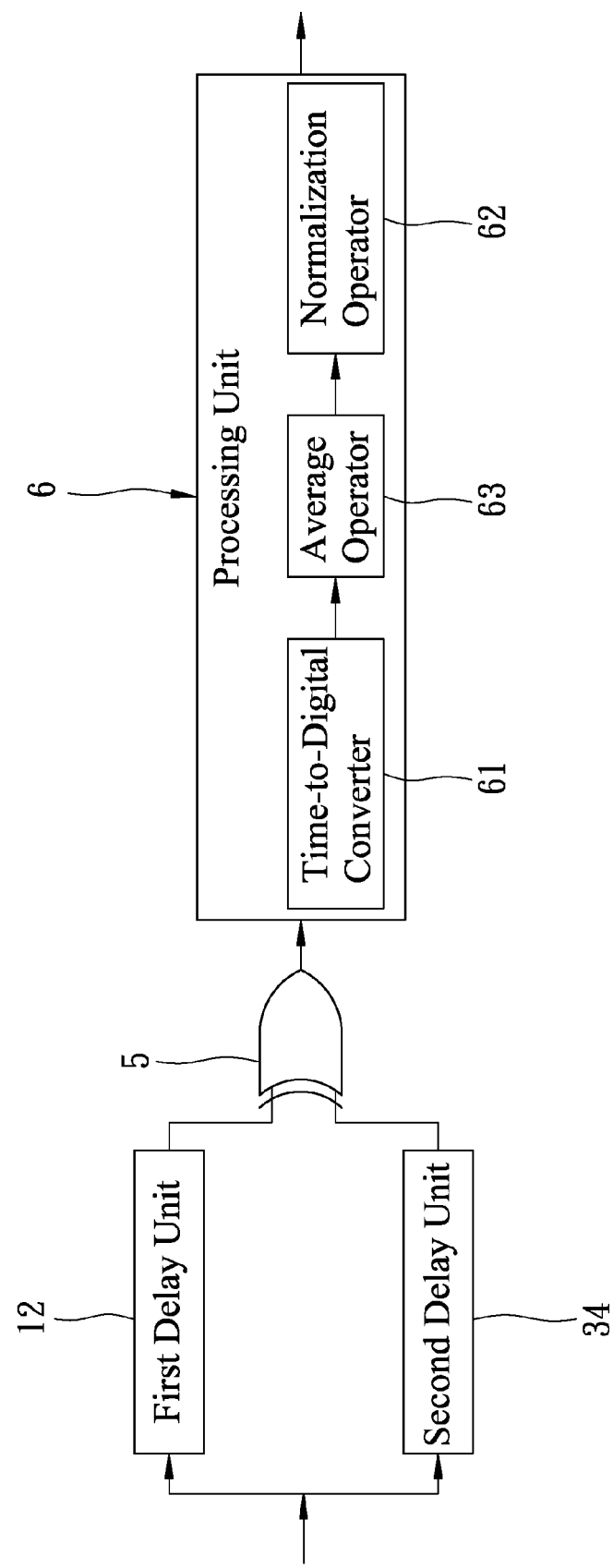
FIG. 9 is a block diagram showing a second implementation of the preferred embodiment.

Referring to FIG. 9, a second implementation similar to the first implementation of the preferred embodiment is shown. The difference with the first implementation is that the processing unit 6 of the second implementation further includes an average operator 63.

Because errors during the time-to-digital conversion operations are expected, in order to minimize the errors, the time-to-digital converter 61 performs multiple time-to-digital conversion operations upon the indication signal to obtain multiple pulse width values corresponding to the pulse width of the indication signal. The average operator 63 is electrically connected to the time-to-digital converter 61 to receive the multiple pulse width values, and averages the multiple pulse width values to obtain an average pulse width value. The normalization operator 62 is electrically connected to the average operator 63 to generate the output signal based on the average pulse width value and the reference signal.

For example, the time-to-digital converter 61 performs three times of the time-to-digital conversion operations upon the indication signal to obtain three pulse width values $W_1=4$, 5, and 6. The average operator 63 averages the pulse width values $W_1$ to obtain the average pulse width value $W_{1,AVG}=5$. Assuming the reference signal is a pulse width value $W_2=1$ converted through the time-to-digital conversion operation from the indication signal that is obtained when the temperature of an environment where the temperature sensitive device is placed is at the second temperature (such as 25° C.), the output signal $Q_{out}$ generated by the normalization operator 62 is the ratio of the average pulse width $W_{1,AVG}$ to the pulse width value $W_2$ of the reference signal, i.e., $Q_{out}=W_{1,AVG}/W_2=5$.

Figure 10:
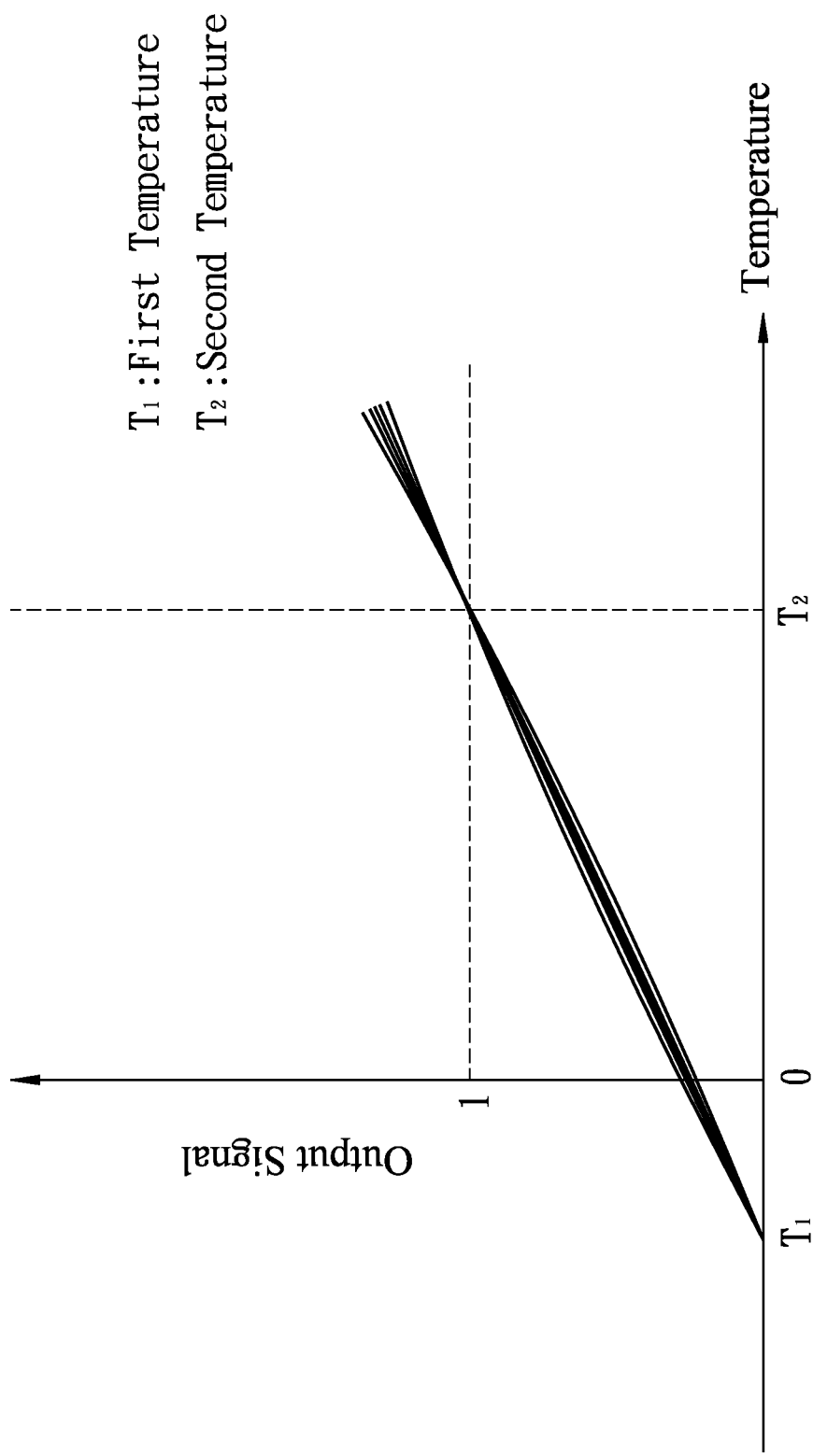
FIG. 10 shows relationships of five output signals to temperature variation, wherein the output signals are respectively outputted from five temperature sensitive devices of the preferred embodiment manufactured with different manufacturing process drifts.

FIG. 10 shows relationships of five output signals to temperature variation, wherein the output signals are respectively outputted from five temperature sensitive devices of the preferred embodiment manufactured with different manufacturing process drifts. It is evident from FIG. 10 that the temperature sensitive devices are able to achieve an effect comparable to two-point calibration through a single one-point calibration (the processing unit 6 generates the output signal with the use of the pulse width value and the reference signal).

To conclude, the first time delay and the second time delay respectively corresponding to the first delay unit 12 and the second delay unit 34 could be substantially the same at the first temperature by adjusting the magnitudes of the first current and the second current, so as to cause the pulse width value of the indication signal to be zero at the first temperature. The processing unit 6 further uses the reference signal to normalize the pulse width value related to the indication signal in order to generate the output signal, so as to achieve the effect of the two-point calibration shown in FIG. 10.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A temperature sensitive device comprising:
   a first delay unit for receiving an input signal and for introducing a first time delay into the input signal so as to generate a first delayed signal, wherein the first time delay is dependent on a manufacturing process of said temperature sensitive device and is substantially independent of a temperature sensed by said temperature sensitive device;
   a second delay unit for receiving the input signal and for introducing a second time delay into the input signal so as to generate a second delayed signal, wherein the second time delay is dependent on the manufacturing process of said temperature sensitive device and the temperature sensed by said temperature sensitive device, and wherein the first time delay and the second time delay are substantially the same when the temperature sensed by said temperature sensitive device is at a first temperature value;

a difference generating unit electrically coupled to said first delay unit and said second delay unit so as to receive the first delayed signal and the second delayed signal therefrom, said difference generating unit generating an indication signal according to the first delayed signal and the second delayed signal, the indication signal indicating a difference between the first time delay and the second time delay; and a processing unit electrically coupled to said difference generating unit so as to receive the indication signal therefrom, said processing unit generating an output signal according to the indication signal and a reference signal, wherein the reference signal indicates a difference between the first time delay and the second time delay when the temperature sensed by said temperature sensitive device is at a second temperature value, and the output signal is dependent on the temperature sensed by said temperature sensitive device and is substantially independent of the manufacturing process of said temperature sensitive device.

2. The temperature sensitive device as claimed in claim 1, wherein said first delay unit includes:

a first delay circuit for receiving the input signal and for introducing the first time delay into the input signal so as to generate the first delayed signal; and a first bias circuit electrically coupled to said first delay circuit, said first bias circuit generating a first current that has a magnitude substantially independent of the temperature sensed by said temperature sensitive device, and cooperating with said first delay circuit to mirror the first current to said first delay circuit, wherein the first time delay corresponds to the first current.

3. The temperature sensitive device as claimed in claim 2, wherein said second delay unit includes:

a second delay circuit for receiving the input signal and for introducing the second time delay into the input signal so as to generate the second delayed signal; and a second bias circuit electrically coupled to said second delay circuit, said second bias circuit generating a second current that has a magnitude dependent on the temperature sensed by said temperature sensitive device, and cooperating with said second delay circuit to mirror the second current to said second delay circuit, wherein the second time delay corresponds to the second current.

4. The temperature sensitive device as claimed in claim 3, wherein said first delay circuit and said second delay circuit are identical in structure.

5. The temperature sensitive device as claimed in claim 4, wherein each of said first delay circuit and said second delay circuit includes first to Nth delay elements connected in series, each of said delay elements having an input and an output, said input of said first delay element receiving the input signal, and a number (N−1) of energy storage elements, each connected to said output of a respective one of said first to (N−1)th delay elements;

wherein said output of said Nth delay element of said first delay circuit provides the first delayed signal; and wherein said output of said Nth delay element of said second delay circuit provides the second delayed signal.

6. The temperature sensitive device as claimed in claim 3, wherein said first bias circuit includes a first current source in a form of a bandgap circuit, and said second bias circuit includes a second current source in a form of a proportional to absolute temperature (PTAT) circuit.

7. The temperature sensitive device as claimed in claim 6, wherein said processing unit is configured to generate the output signal according to a ratio of the difference indicated by the indication signal to the difference indicated by the reference signal.

8. The temperature sensitive device as claimed in claim 1, wherein the indication signal is in a form of a pulse signal, and a pulse width of the indication signal is proportional to the difference between the first time delay and the second time delay.

9. The temperature sensitive device as claimed in claim 8, wherein said difference generating unit is configured to perform an XOR logic operation on the first delayed signal and the second delayed signal to generate the indication signal.

10. The temperature sensitive device as claimed in claim 8, wherein said processing unit is configured to perform a time-to-digital conversion operation upon the indication signal to obtain a pulse width value corresponding to the pulse width of the indication signal, and to generate the output signal based on the pulse width value and the reference signal.

11. The temperature sensitive device as claimed in claim 8, wherein said processing unit is configured to perform multiple time-to-digital conversion operations upon the indication signal to obtain multiple pulse width values corresponding to the pulse width of the indication signal, to obtain an average pulse width value from the multiple pulse width values, and to generate the output signal based on the average pulse width value and the reference signal.

12. The temperature sensitive device as claimed in claim 1, wherein said processing unit is configured to generate the output signal according to a ratio of the difference indicated by the indication signal to the difference indicated by the reference signal.

* * * * *